(12) United States Patent
Schaffner et al.

(10) Patent No.: US 8,042,413 B2
(45) Date of Patent: Oct. 25, 2011

(54) TRANSVERSE FORCE MEASUREMENT

(75) Inventors: Georges Schaffner, Hittnau (CH);
Andreas Kirchheim, Pfungen (CH);
Andri Lehmann, Neftenbach (CH)

(73) Assignee: Kistler Holding AG, Winterthur (CH)

(*) Notice: Subject to any disclaimer, the term of this patent is extended or adjusted under 35 U.S.C. 154(b) by 142 days.

(21) Appl. No.: 12/302,919

(22) PCT Filed: Jun. 11, 2007

(86) PCT No.: PCT/CH2007/000287
§ 371 (c)(1),
(2), (4) Date: Dec. 1, 2008

(87) PCT Pub. No.: WO2007/143870
PCT Pub. Date: Dec. 21, 2007

(65) Prior Publication Data
US 2009/0235762 A1 Sep. 24, 2009

(30) Foreign Application Priority Data
Jun. 14, 2006 (CH) .......................................... 973/06

(51) Int. Cl.
*G01L 1/16* (2006.01)
(52) U.S. Cl. .................................................... 73/862.68
(58) Field of Classification Search ............... 73/777, 73/862.08, 862.68
See application file for complete search history.

(56) References Cited

U.S. PATENT DOCUMENTS

| | | | | |
|---|---|---|---|---|
| 3,746,895 A * | 7/1973 | Goble | ............................ | 310/335 |
| 4,649,312 A | 3/1987 | Robin et al. | | |
| 4,885,498 A * | 12/1989 | Wakita | ........................... | 310/328 |
| 5,166,907 A * | 11/1992 | Newnham et al. | ............ | 367/157 |
| 5,608,282 A * | 3/1997 | Wilber et al. | ................... | 505/211 |
| 5,991,988 A * | 11/1999 | Tabota et al. | ................. | 29/25.35 |
| 6,269,697 B1 * | 8/2001 | Okada | ......................... | 73/504.02 |
| 6,278,226 B1 * | 8/2001 | Danov et al. | .................... | 310/359 |
| 6,278,227 B1 * | 8/2001 | Katsuno et al. | ................ | 310/359 |
| 6,425,514 B1 | 7/2002 | Ou et al. | | |
| 6,794,797 B2 * | 9/2004 | Hinkov et al. | ................ | 310/331 |

FOREIGN PATENT DOCUMENTS

| | | |
|---|---|---|
| DE | 3146948 | 6/1983 |
| DE | 4439297 | 5/1996 |
| GB | 1537154 | 12/1978 |

OTHER PUBLICATIONS

English translation of International Preliminary Examination Report on Patentability, issued Jan. 29, 2009.

* cited by examiner

*Primary Examiner* — Max Noori
(74) *Attorney, Agent, or Firm* — Dority & Manning, P.A.

(57) ABSTRACT

A piezoelectric sensor for bending moment measurements has measuring elements separating at their axes and electrically connecting both halves with their opposing directions of polarization. Such a sensor, mounted with its axis on the neutral bending axis of a machine structure, thus measures concurrently both tension and compression of the machine on both sides of the axis thereof.

41 Claims, 3 Drawing Sheets

TRANSVERSE FORCE MEASUREMENT

CROSS-REFERENCE TO RELATED APPLICATIONS

This application claims priority to Swiss Application No. 973/06 filed Jun. 14, 2006, and International Application Serial No. PCT/CH2007/000287 filed Jun. 11, 2007.

TECHNICAL FIELD

The invention relates to a piezoelectric sensor for bending moment or torque measurements with at least one axis comprising at least two piezoelectric plate elements arranged in juxtaposition in a plane in accordance with the preambles of the independent claims.

BACKGROUND

Sensors for bending moment or torque measurements are widely used in the industry, for example for the determination of the force of a force transmission arm of a wire welding contact plant, which is also referred to as wire bonding plant.

In U.S. Pat. No. 6,425,514 a process is shown, in which a conventional force or pressure sensor is brought between the welding arm and the structure of a wire welding contact plant. Finally, the welding load at the tip of the welding arms may be computed by means of the measured forces.

The disadvantage of such a device consists in the fact, that most preferable two of such sensors should be incorporated, in order to increase the measuring accuracy. However, due to reasons of economy this is done in the minority of cases.

BRIEF OBJECTS AND SUMMARY OF THE INVENTION

The object of the present invention is to provide a sensor for bending moment or torque measurements which exhibits an increased sensitivity in comparison to a conventional sensor of this type at comparable production costs.

The object is solved by the characteristics of the independent claims.

The invention relates to the idea of metrological separating a measuring element in a piezoelectric sensor for bending moment or torque measurements in its axis and electrically connecting both halves with their opposing polarization directions. Thus, such a sensor, attached with its axis to the neutral bending axis of a machine structure, concurrently measures both tension and compression of the machine structure on both sides of the axis thereof. Then, a particular advantage exists if the measuring element is integrally formed and only the electrodes on the measuring element are separated from each other.

BRIEF DESCRIPTION OF THE DRAWINGS

In the following, the invention is illustrated in more detail with respect to the drawings.

DETAILED DESCRIPTION OF EXEMPLARY EMBODIMENTS

Figure 1A:
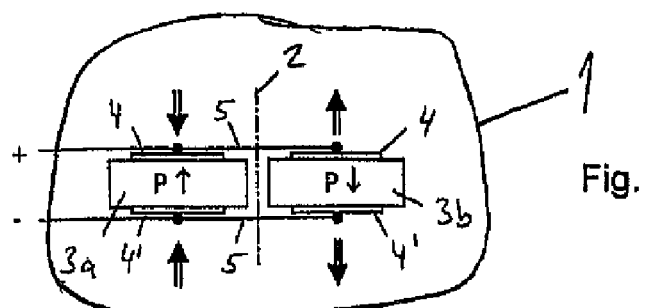
FIG. 1a is a cross-sectional view of two plate elements, arranged in opposite orientation direction, with electrodes and the electrical connections thereof.

In all Figures the designation and numbering is identical for the same components.

The FIGS. 1a-f each show a cross section of at least two plate elements 3a, 3b of a piezoelectric sensor 1 for bending moment or torque measurements. The double arrows in the FIG. 1 designate a possible force or tension effect on the plate elements which is to be measured. Plate elements 3a, 3b are meant to be parts of plates. These plate elements are juxtaposed in a plane in a laminar manner. The orientation direction P is meant to be the polarization direction of a plate element under the application of force. This direction is denoted by a simple arrow and P.

The plate elements 3a, 3b consist of piezoelectric material with longitudinal effect. One axis 2 of the sensor proceeds between said plate elements 3a, 3b. The field of application of such a sensor 1 is assigned for bending moment or torque measurements with a neutral bending axis 9 (FIG. 3) on the axis 2 of sensor 1. Therefore, the moment to be measured would result from a force which acts corresponding to the double arrows shown. Such a moment would cause a compression in plate element 3a and an elongation in plate element 3b. The plate elements 3a, 3b each exhibit electrodes 4, 4' on both sides, which collect the charge developed there in a measurement.

The electrode 4 or 4' of the first plate element 3a is electrically connected with the electrode 4 or 4' of the opposite polarization (+, −) of the second plate element 3b. Such a connection can emerge in the sensor or in the evaluation device.

Electrical connections 5 each connect the electrodes 4, 4' with opposite polarizations (+, −) of the two plate elements 3a, 3b, which are formed in a measurement. Thereby, in identical embodiments and symmetrical arrangements with respect to axis 2 of the two halves, the signal doubles itself.

The electrodes 4, 4' may be designed as metallizations on the piezoelectric plate elements or as independent components in the form of conductive plates.

The plate elements 3a, 3b are attached in the sensor in a biased manner, so that pressure and tension can be measured.

In FIG. 1a the plate elements 3a, 3b are arranged in opposite orientation direction P, thus, each electrical connection 5 connects the electrodes 4 on the same side of the plate elements 3a, 3b. In this example the electrodes 4, 4' and the electrical connections 5 each may be commonly designed as a single conductive layer or plate.

Figure 1B:
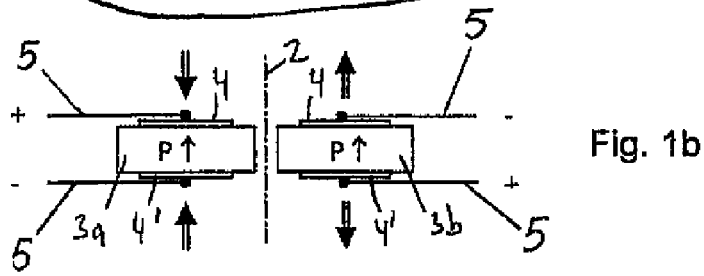
FIG. 1b is a cross-sectional view of two plate elements, arranged in identical orientation direction, with electrodes and the electrical connections thereof.

In FIG. 1b a device is indicated, which in contrast to FIG. 1a exhibits two plate elements 3a, 3b arranged in the same orientation direction P. Accordingly, the electrodes 4, 4' are not connected with each other in a plane but in a diagonal manner, with opposite polarizations (+, −). This connection is not shown but is obvious only from the signs plus (+) and minus (−) at the ends of the electronic connections 5. The ends with identical signs are electrically connected with each other in the sensor or in the evaluating device.

Figure 1C:
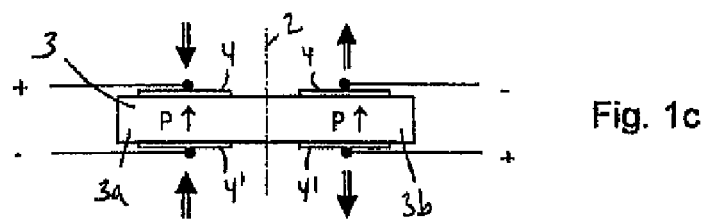
FIG. 1c is a cross-sectional view of two plate elements on the same plate, with electrodes and the electrical connections thereof.

The embodiment in FIG. 1c largely corresponds to that of FIG. 1b, wherein the plate elements 3a, 3b are integrally designed in a plate 3. This is possible without any difficulties, since the orientation directions P of the plate elements 3a, 3b proceed equally. Therefore, in this embodiment the piezoelectric plate may be used as a printed circuit board, on to which the electrodes are applied as metallized surfaces, similar to those of switch plates. The advantage of this arrangement consists in the fact that only one plate has to be processed and incorporated, which simplifies the handling.

Figure 1D:
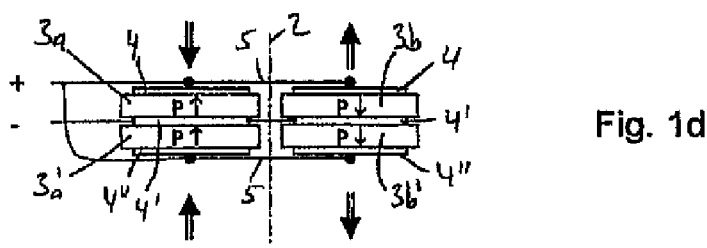
FIG. 1d is a cross-sectional view of a pair of two plate elements, arranged in opposite orientation direction, with electrodes and the electrical connections thereof.
Figure 1E:
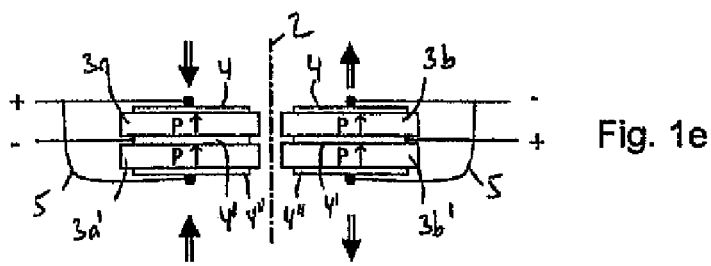
FIG. 1e is a cross-sectional view of a pair of two plate elements, arranged in identical orientation direction, with electrodes and the electrical connections thereof.
Figure 1F:
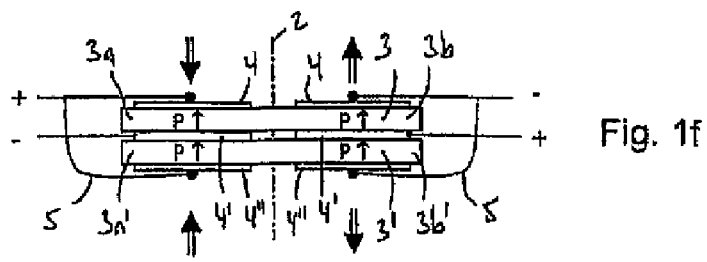
FIG. 1f is a cross-sectional view of a pair of two plate elements each on the same plate, with electrodes and the electrical connections thereof.

The FIGS. 1d, 1e and 1f each represent a stack of plate elements 3a, 3a' and 3b, 3b' corresponding to the embodiments of the FIGS. 1a, 1b and 1c. Analogously, three and more plate elements 3a'', 3b'' may also be arranged in a stacked manner. Preferably, the electrodes 4' between the plate elements 3a, 3a' abutting in the stack and the plate elements 3b, 3b' are achieved by metallizations. Preferably, the metallizations interconnect adjacent plate elements. This connection facilitates the handling of individual plate elements.

The electrodes 4 each are electronically connected with those of the layers after the next 4'' by electrical connections 5 in the sensor or in the evaluating device. Analogously, this also applies to more than two layers in the stack.

Figure 2:
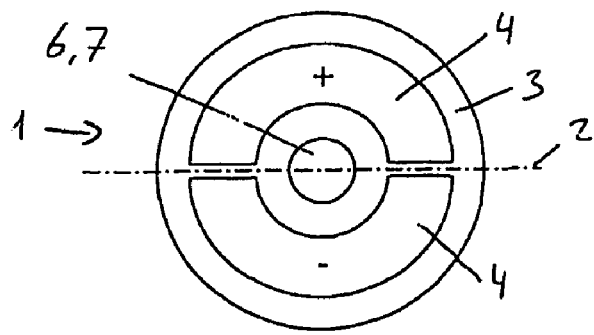
FIG. 2 is a top view of a sensor according to the present invention with two plate elements.

In FIG. 2, a top view of a sensor 1 according to the present invention is shown corresponding to FIG. 1c with a continuous plate 3 and two electrodes 4 with opposite polarizations (+, −), which appear in a measurement. The electrodes 4 are arranged on both sides of the axis 2, which has to be on the neutral bending axis of a machine part in the integrated state. The corresponding opposite electrodes 4' with opposite polarizations are arranged on the back side of the sensor.

Preferably, an attachment device 6, for example in the form of a recess 7 for feeding through a fixing screw or an equivalent is provided in the centre of the sensor.

Figure 3:
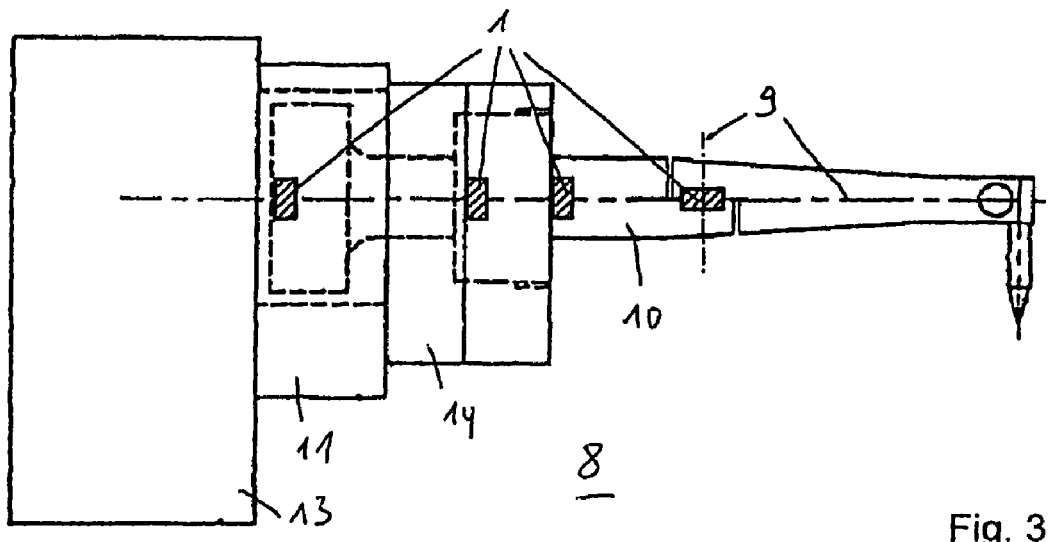
FIG. 3 is a cross-sectional view of a machine structure in the form of a bond arm with its structure with possible positions for the assembly of a sensor according to the present invention.

FIG. 3 represents a cross section of a machine structure 8 in the form of a force transmission arm 10 with a structure 11 with various possible positions for the assembly of a sensor according to the present invention 1. The neutral bending axis 9 is the area in the machine structure, in which neither an elongation nor a compression arises in the course of appropriately applying stress to the machine structure. The sensor 1 according to the present invention may be attached at any location along this neutral bending axis 9, wherein axis 2 of sensor 1 always has to be in this neutral bending axis 9. Thus, a compression on one side of axis 2 has an opposite and identical effect to a tension on the other side thereof. By proper combination of the electrodes 4, 4', in particular by the connection of the opposite polarizations of the electrodes 4, 4' on both sides of the axis 2, the signals are summed. In a symmetrical arrangement, this means a doubling.

According to the present invention, as is also shown in FIG. 3, the sensor 1 can also be attached in a section in an arm of the machine structure, wherein the section specifically is made for this purpose. By the assembly in the centre of the sensor by an assembly screw said assembly axis becomes the neutral bending axis 9 under a load at the end of the arm.

Figure 4:
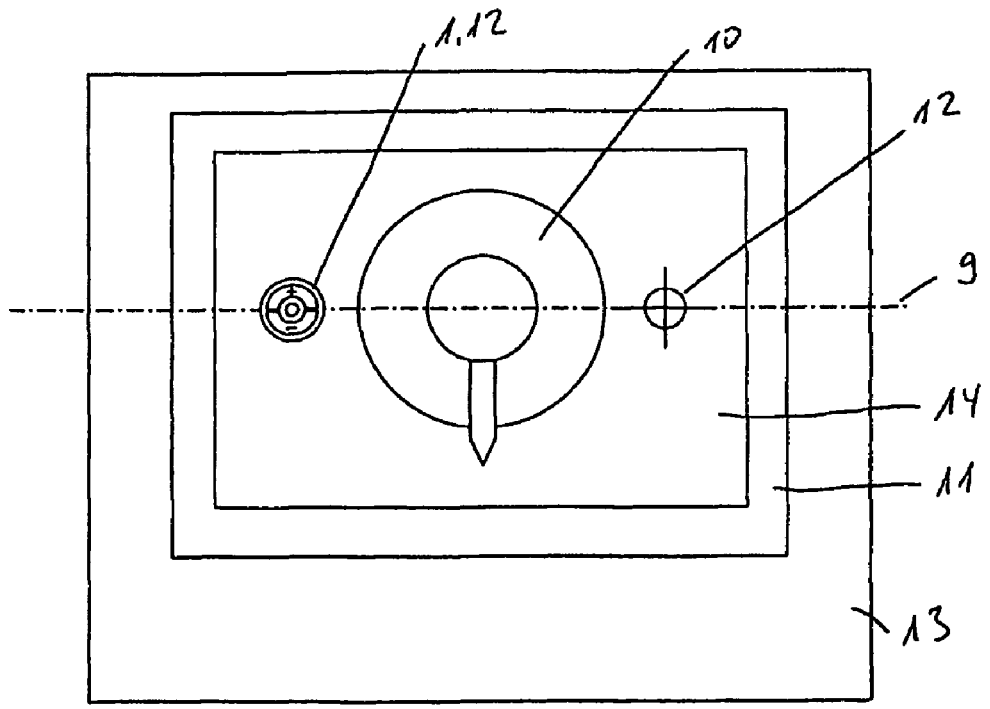
FIG. 4 is a front view of a machine structure in the form of a force transmission arm with its structure with possible positions for the assembly of a sensor according to the present invention.

FIG. 4 shows the same arrangement of a machine structure as FIG. 3, however, in a front view. The structure 11, adjacent to an actuator 13, accommodates force transmission arm 10 by means of attachment 14. The neutral bending axis 9 proceeds as indicated by the entire machine structure 8. The sensor 1 according to the present invention can also be arranged laterally of the center, for example in one assembly point 12, which proceeds on the neutral bending axis 9. The other assembly point 12 should exhibit the same rigidity as sensor 1, in order to generate no measurement errors. Otherwise, a second sensor can be attached in a second assembly point to increase the measurement accuracy.

The advantage of this sensor according to the present invention is its simple installability without causing process interferences. Further, the sensitivity is increased by the division of the electrode.

A further advantage of the present invention resides in the ability of evaluation. If the electrodes 4 of the individual plate elements 3a, 3b are not combined in sensor 1 by the electrical connections 5, but are directed separately to the evaluating device or amplifier, additional physical variables may then be determined. On the one hand, the bending moment which would have emerged by the electrical connections 5 may be calculated by the summation of the measurement values. On the other hand, the force which affects the sensor may be determined by calculating the difference of the measurement values. This applies to an arrangement of the plate elements in accordance with FIG. 1a, in the examples according to FIG. 1b or 1c the calculation of the difference results in the bending moment and the summation results in the force.

Figure 5A:
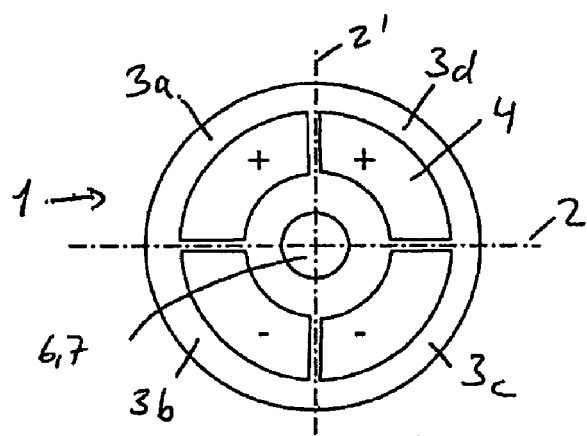
FIG. 5a is a top view of a sensor according to the present invention with four plate elements.
Figure 5B:
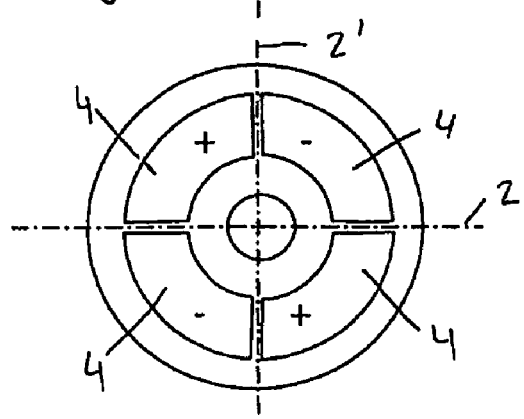
FIG. 5b is a top view of another sensor according to the present invention with four plate elements.

An extension of the invention is shown in FIGS. 5a and 5b. Analogously to the embodiment described, the sensor may also be designed with four instead of two plate elements 3a, 3b, 3c, 3d, by insertion of a second axis 2', which is vertically arranged to the first axis 2 and which divides the sensor into four parts. A sensor designed in such a manner permits flexures in both axes and in the combination thereof. For this purpose, the electrodes 4 have to be evaluated separately. The graduation of the electrodes may be selected, so that either equal orientation directions P are located on diagonal opposite sites, as shown in FIG. 5a, or next to each other, as shown in FIG. 5b. Therefore, a sensor according to FIG. 5 permits bending moments in two directions as well as a force measurement in one direction.

Figure 6A:
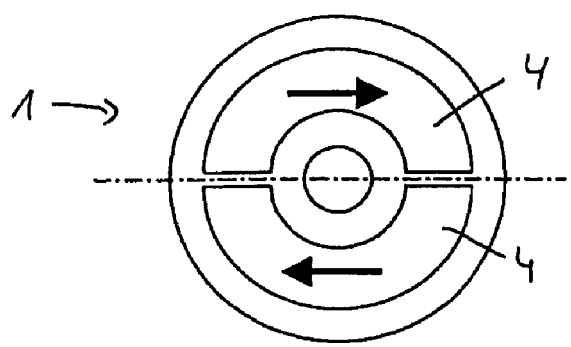
FIG. 6a is a top view of another sensor according to the present invention with two plate elements, which are sensitive to shear.

A further extension of the present invention is shown in FIG. 6a. Instead of plate elements from piezoelectric material with longitudinal effect, a material with longitudinal shearing effect is used. Thus shear and torque may be measured simultaneously, if the signals of the plate elements are separately evaluated as described in FIG. 5. Here, similar to the type described in FIG. 1a to 1f plate 3 can also be divided into plate elements 3a, 3b or the electrode 4 may be separated, and several plates may be used in a stacked manner.

Figure 6B:
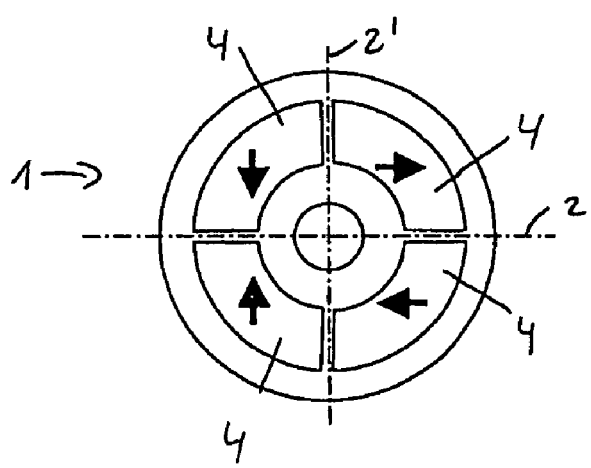
FIG. 6b is a top view of another sensor according to the present invention with four plate elements, which are sensitive to shear.

FIG. 6b shows a combination of shear sensitive plates in various directions, which may be evaluated analogously to the description in FIG. 5.

Various planes with plate elements of various piezoelectric effects may be combined in a sensor, so that a variety of physical variables may be determined simultaneously.

REFERENCE SYMBOL LIST 1 sensor
2 2' axes
3 plate
3a, 3b, 3c, 3d, 3a', 3b' plate elements
4 4' electrodes
5 electrical connections of the electrodes
6 attachment device
7 recess
8 machine structure
9 neutral bending axis
10 force transmission arm
11 structure
12 point of assembly
13 actuator
14 attachment

The invention claimed is:

1. Piezoelectric sensor for bending moment or torque measurement with at least one axis, the sensor comprising a housing containing at least two piezoelectric plate elements arranged in juxtaposition in a plane which are at least partially provided with electrodes on both sides and which are arranged on both sides of the axis under mechanical bias by the housing of the sensor so that pressure and tension can be measured, wherein each of the electrodes of the first plate element is electrically connected with the electrode of the opposite polarization (+, −) of the second plate element.

2. Sensor according to claim 1, wherein the plate elements on the same plate are integrally designed.

3. Sensor according to claim 1, wherein the plate elements are designed in two parts.

4. Sensor according to claim 3, wherein the plate elements with opposite orientation direction P are arranged in the sensor.

5. Sensor according to claim 3, wherein the plate elements with the same orientation direction P are arranged in the sensor.

6. Sensor according to claim 1, wherein the plate elements are identical.

7. Sensor according to claim 1, wherein the plate elements are arranged symmetrically with respect to the axis.

8. Sensor according to claim 1, wherein the sensor contains an attachment device in the centre of the axis.

9. Sensor according to claim 8, wherein the sensor exhibits a central recess for feeding through a screw.

10. Sensor according to claim 1, wherein several plate elements are arranged in multiple layers in a stacked manner and are designed with intermediate electrodes, wherein the electrodes each are electronically connected with those of the layers after the next.

11. Sensor according to claim 10, wherein the intermediate electrodes are metallizations, which in each case interconnect plate elements abutting in the stack.

12. Sensor according to claim 1, wherein the plate elements exhibit piezoelectric longitudinal effect for the determination of a bending moment around the axis.

13. Sensor according to claim 1, wherein the plate elements exhibit piezoelectric longitudinal shearing effect for the determination of a torque around a central rotation axis vertical to the plate plane.

14. Piezoelectric sensor for bending moment or torque measurements as well as for force or pressure measurements with at least one axis comprising a housing containing at least two piezoelectric plate elements which are arranged in juxtaposition in a plane and which are at least partially provided with electrodes on both sides and which are arranged on both sides of the axis under mechanical bias by the housing of the sensor so that pressure and tension can be measured, wherein the electrodes are directed electrically separated from each other to an evaluation unit for the individual measurement value determination of each plate element.

15. Sensor according to claim 14, wherein the plate elements are integrally designed on the same plate.

16. Sensor according to claim 14, wherein the plate elements are designed in two parts.

17. Sensor according to claim 16, wherein the plate elements with opposite orientation direction P are arranged in the sensor.

18. Sensor according to claim 16, wherein the plate elements with the same orientation direction P are arranged in the sensor.

19. Sensor according to claim 14, wherein the plate elements are identical.

20. Sensor according to claim 14, wherein the plate elements are arranged symmetrically with respect to the axis.

21. Sensor according to claim 14, wherein the sensor contains an attachment device in the centre of the axis.

22. Sensor according to claim 21, wherein the sensor exhibits a central recess for feeding through a screw.

23. Sensor according to claim 14, wherein several plate elements are arranged in multiple layers in a stacked manner and are designed with intermediate electrodes, wherein the electrodes each are electronically connected with those of the layers after the next.

24. Sensor according to claim 23, wherein the intermediate electrodes are metallizations, which in each case interconnect plate elements abutting in the stack.

25. Sensor according to claim 14, wherein the plate elements exhibit a piezoelectric longitudinal effect for the determination of a bending moment around axis and of a force or a pressure vertical to the plate plane.

26. Sensor according to claim 14, wherein the plate elements exhibit a piezoelectric longitudinal shearing effect for the determination of a torque around a central rotation axis vertical to the plate plane as well as a shearing force in the plate plane towards the axis.

27. Piezoelectric sensor for bending moment or torque measurements as well as for force or pressure measurements with at least one axis comprising
   at least two piezoelectric plate elements which are arranged in juxtaposition in a plane and which are at least partially provided with electrodes on both sides and which are arranged on both sides of the axis under bias in the sensor,
   wherein the electrodes are directed electrically separated from each other to an evaluation unit for the individual measurement value determination of each plate element,
   a second axis vertical to the first axis and at least four identical piezoelectric plate elements of the type described, which are symmetrically arranged in each of the four segments of the sensor defined by the axes, wherein the electrodes are directed electrically separated from each other to an evaluation unit for the individual measuring value determination of each plate element for the determination of the bending moment measurement with respect to both axes or the measurement of torque.

28. Sensor according to claim 27, wherein the plate elements are individually designed.

29. Sensor according to claim 28, wherein the individual plate elements are selected in such a manner that bending moment or torque measurements as well as shearing forces may be measured in two directions.

30. Application of a sensor according to claim 1 for indirect bending or torque measurements of a machine structure, wherein the sensor is attached to the machine structure in such a manner that the axis of the sensor is on the bending axis of the machine structure.

31. Application according to claim 30, wherein the machine structure is an electrical wire welding contact plant comprising a force transmission arm at a structure.

32. Application according to claim 31, wherein the sensor is arranged in the force transmission arm.

33. Application according to claim 32, wherein the sensor is transversally attached in the force transmission arm in a section line.

34. Application according to claim 31, wherein at least one sensor is arranged in one of the assembly points, which connects the force transmission arm with the structure of the wire welding contact plant.

35. Application according to claim 34, wherein two sensors are arranged in such assembly points.

36. Application of a sensor according to claim 14 for indirect bending or torque measurements of a machine structure, wherein the sensor is attached to the machine structure in such a manner that the axis of the sensor is on the bending axis of the machine structure.

37. Application according to claim 36, wherein the machine structure is an electrical wire welding contact plant comprising a force transmission arm at a structure.

38. Application according to claim 37, wherein the sensor is arranged in the force transmission arm.

39. Application according to claim 38, wherein the sensor is transversally attached in the force transmission arm in a section line.

40. Application according to claim 37, wherein at least one sensor is arranged in one of the assembly points, which connects the force transmission arm with the structure of the wire welding contact plant.

41. Application according to claim 37, wherein two sensors are arranged in such assembly points.

* * * * *